United States Patent
He et al.

(10) Patent No.: US 9,541,463 B2
(45) Date of Patent: Jan. 10, 2017

(54) CAPACITIVE PRESSURE SENSORS

(71) Applicants: Semiconductor Manufacturing International (Beijing) Corporation, Beijing (CN); Semiconductor Manufacturing International (Shanghai) Corporation, Shanghai (CN)

(72) Inventors: Qiyang He, Shanghai (CN); Chenglong Zhang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/931,043

(22) Filed: Nov. 3, 2015

(65) Prior Publication Data

US 2016/0054189 A1     Feb. 25, 2016

Related U.S. Application Data

(62) Division of application No. 14/161,740, filed on Jan. 23, 2014, now Pat. No. 9,207,138.

(30) Foreign Application Priority Data

Aug. 28, 2013 (CN) .......................... 2013 1 0381786

(51) Int. Cl.
  *H01L 21/76* (2006.01)
  *G01L 9/00* (2006.01)
  (Continued)

(52) U.S. Cl.
  CPC .......... *G01L 9/0073* (2013.01); *B81B 3/0021* (2013.01); *B81C 1/00134* (2013.01); *B81C 1/00698* (2013.01); *B81B 2201/0264* (2013.01)

(58) Field of Classification Search
  CPC .................... B81B 3/0021; B81B 2201/0264; B81C 1/00134
  (Continued)

(56) References Cited

U.S. PATENT DOCUMENTS 6,319,787 B1    11/2001    Enders et al.
6,593,613 B1     7/2003    Alsmeier et al.
(Continued)

*Primary Examiner* — Phat X Cao
*Assistant Examiner* — Mohammad M Hoque
(74) *Attorney, Agent, or Firm* — Anova Law Group, PLLC

(57) ABSTRACT

A capacitive pressure sensor is provided. The capacitive pressure sensor includes a substrate; and a first electrode formed in one surface of the substrate and vertical to the surface of the substrate. The capacitive pressure sensor also includes a second electrode with a portion facing the first sub-electrode, a portion facing the second sub-electrode and a portion formed in the other surface of the substrate. Further, the capacitive pressure sensor includes a first chamber between the first electrode and the second electrode and a second chamber formed in the second electrode. Further, the pressure sensor also includes a first sealing layer formed on the second electrode; and a second sealing layer formed on the other surface of the substrate.

18 Claims, 6 Drawing Sheets

(51) Int. Cl.
*B81B 3/00* (2006.01)
*B81C 1/00* (2006.01)

(58) Field of Classification Search
USPC .......................................... 257/415; 438/51
See application file for complete search history.

(56) References Cited

U.S. PATENT DOCUMENTS

| | | | |
|---|---|---|---|
| 6,720,604 B1* | 4/2004 | Fritzinger | H01L 28/60 257/306 |
| 8,030,112 B2 | 10/2011 | Hsieh et al. | |
| 2002/0158040 A1 | 10/2002 | Lucak et al. | |
| 2004/0129961 A1* | 7/2004 | Paz de Araujo | C30B 29/32 257/295 |
| 2005/0110110 A1 | 5/2005 | Blanchard et al. | |
| 2008/0020573 A1 | 1/2008 | Birkmeyer et al. | |
| 2009/0146257 A1* | 6/2009 | Yun | H01L 23/5223 257/535 |
| 2009/0278628 A1 | 11/2009 | Sworowski et al. | |
| 2012/0329267 A1 | 12/2012 | Horak et al. | |
| 2013/0200448 A1* | 8/2013 | Yen | H01L 23/5228 257/296 |
| 2013/0283911 A1 | 10/2013 | Ayazi et al. | |
| 2014/0230547 A1 | 8/2014 | El-Gamal et al. | |
| 2014/0361388 A1 | 12/2014 | Chan et al. | |
| 2015/0060972 A1 | 3/2015 | Bulsara et al. | |
| 2015/0078590 A1 | 3/2015 | Daley et al. | |

* cited by examiner

CAPACITIVE PRESSURE SENSORS

CROSS-REFERENCES TO RELATED APPLICATIONS

This application is a divisional of U.S. patent application Ser. No. 14/161,740, filed on Jan. 23, 2014,witch claims the priority of Chinese patent application No. 201310381786.1, filed on Aug. 28, 2013, the entirety of all of which is incorporated herein by reference.

FIELD OF THE INVENTION

The present invention generally relates to the field of micro-electro-mechanical systems (MEMS) and, more particularly, relates to capacitive pressure sensors and fabrication techniques thereof.

BACKGROUND

Currently used pressure sensors include piezoresistive pressure sensors, piezoelectric pressure sensors, capacitive pressure sensors, potentiometric pressure sensors, inductance-bridge pressure sensors and strain gauges, etc. Among of these types of pressure sensors, capacitive pressure sensors have attracted more and more attentions in market because they have a relatively high sensitivity; and they are not easy to be affected by external environments, etc.

Conventional capacitive pressure sensors have some limitations, such as relatively large size, relatively complex fabrication processes and inconvenient operations, etc. In order to overcome these issues, a micro-electro-mechanical system (MEMS) technology has been introduced to form capacitive pressure sensors. The capacitive pressure sensors formed by the MEMS technology may have a plurality of advantages, such as small size, mass production, low cost, and high accuracy, etc. Further, the capacitive pressure sensors formed by the MEMS technology can be integrated with their control circuits on a same substrate, thus weak output signals from the capacitive sensors can be processed at nearby locations. Therefore, electromagnetic interferences to the capacitive pressure sensors may be prevented, and the liability of signal transformations may be improved.

FIG. 1 illustrates an existing capacitive pressure sensor formed by the MEMS technology.

As shown in FIG. 1, the capacitive pressure sensor includes a semiconductor substrate 10 and a doping region 14 in the semiconductor substrate 10. The doping region 14 is configured as a bottom electrode of a planar capacitor. The capacitive pressure sensor also includes a membrane 13 formed above the doping region 14. The membrane 13 is configured as a top electrode of the planar capacitor. Further, the capacitive pressure includes a base 11 configured to support the membrane 13. Further, the capacitive pressure sensor also includes a chamber 12 between the doping region 14 and the membrane 13. The membrane 13, the doping region 14 and the chamber 12 form the planar capacitor. Further, the capacitive pressure sensor also includes a control circuit (not shown) in the base 11. The control circuit connects with the planar capacitor.

When a pressure is applied on the membrane 13 of the planar capacitor, or the inside of the membrane 13 and the outside of the membrane 13 has a pressure difference, the center of the membrane 13 is deformed, thus the capacitance of the planar capacitor is changed. The capacitance change of the planar capacitor can be detected by the control circuit, and the pressure change is obtained. The capacitance of the planar capacitor can be calculated by an equation (1): $C=\in S/d$. "$\in$" is a dielectric constant of the dielectric material filled in the chamber 12. "S" is an overlap area of the membrane 13 and the doping region 14. "d" is a distance between the membrane 13 and the doping region 14. A relationship between the capacitance change of the capacitor ($\Delta C=C-C$) and a detected pressure can be described by an equation (2): $F=PA=Kd_0(\Delta C)/C_0$. "F" is an elastic force measured by the planar capacitor. "K" is a spring constant of the membrane 13. "$d_0$" is an initial distance between the membrane 13 and the doping region 14. "$C_0$" is an initial capacitance of the planar capacitor. Thus, it is convenient to obtain the force F by sensing the capacitance change of the planar capacitor using the control circuit.

However, the sensitivity of the capacitive pressure sensor may be relatively low; and the capacitive pressure sensor may occupy a relatively large area of a semiconductor substrate. The disclosed device structures and methods are directed to solve one or more problems set forth above and other problems.

BRIEF SUMMARY OF THE DISCLOSURE

One aspect of the present disclosure includes a method for fabricating a capacitive pressure sensor. The method includes providing a substrate; and forming a trench in a surface of the substrate. The method also includes forming a first electrode including a first sub-electrode and a second sub-electrode on a side surface of the trench; and forming a first sacrificial layer on the first electrode. Further, the method includes etching the substrate under the bottom of the trench to form an etching hole in the substrate under the bottom of the trench; and forming a electrode on a side surface and a bottom surface of the trench, a portion of the bottom of the trench, and a side surface of the first sacrificial layer. Further, the method also includes forming a second sacrificial layer on the second electrode and filling up the trench and the etching hole; and forming a first sealing layer on the second sacrificial layer. Further, the method also includes removing the first sacrificial layer to form a first chamber between the first electrode and the second electrode; and planarizing the substrate or etching the substrate to expose the sacrificial layer on the bottom surface of the etching hole. Further, the method also includes removing the second sacrificial layer in the trench and the etching hole to form a second chamber in the second electrode; and forming a second sealing layer on the other surface of the substrate to seal the second chamber.

Another aspect of the present disclosure includes a capacitive pressure sensor. The capacitive pressure sensor includes a substrate; and a electrode formed in one surface of the substrate and vertical to the surface of the substrate. The capacitive pressure sensor also includes a second electrode with a portion facing the first sub-electrode, a portion facing the second sub-electrode and a portion formed in the other surface of the substrate. Further, the capacitive pressure sensor includes a first chamber between the first electrode and the second electrode; and a second chamber in the second electrode. Further, the pressure sensor also includes a first sealing layer formed on the second electrode; and a second sealing layer formed on the other surface of the substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
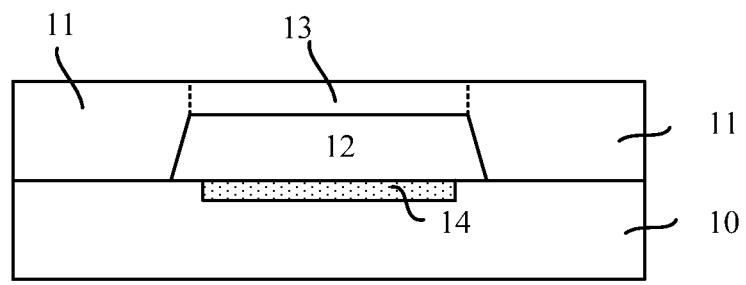
FIG. 1 illustrates an existing capacitive pressure sensor.

Referring to FIG. 1, the planar capacitor may be used as the sensing element of a capacitive pressure sensor. The planar capacitor formed by the MEMS technology includes the doping region 14 (bottom electrode), the membrane 13 (top electrode) corresponding to the doping region 14 and a chamber 12 (dielectric) between the doping region 14 and the membrane 13.

The sensitivity of a capacitive pressure sensor may be an important parameter to evaluate the performance of the capacitive pressure sensor; and an area of the membrane 13 or an overlap area between the membrane 13 and the doping region 14 may be an important parameter affecting the sensitivity of the capacitive pressure sensor. Normally, with a same thickness of the membrane 13, a larger area of the membrane 13 may bring out a larger pressure sensing area, thus the membrane may have a higher sensitivity to the pressure, and a distance change between the membrane 13 and the doping region 14 may become more sensitive. Therefore, the sensitivity of the capacitive sensor may be increased.

Although increasing the area of the membrane 13 or the overlap area between the membrane 13 and the doping region 14 may increase the sensitivity of the capacitive pressure sensor, increasing the area of the membrane 13 or the overlap area between the membrane 13 and the doping region 14 may cause the capacitive pressure sensor to occupy more area on a semiconductor substrate, thus it may be unable to help to increase an device integration level. Thus, the sensitivity and a sensing limitation of the capacitive pressure sensor using the planar capacitor may need to be improved. Three dimensional capacitive pressure sensors formed by a MEMS technology are disclosed to overcome these issues.

Figure 14:
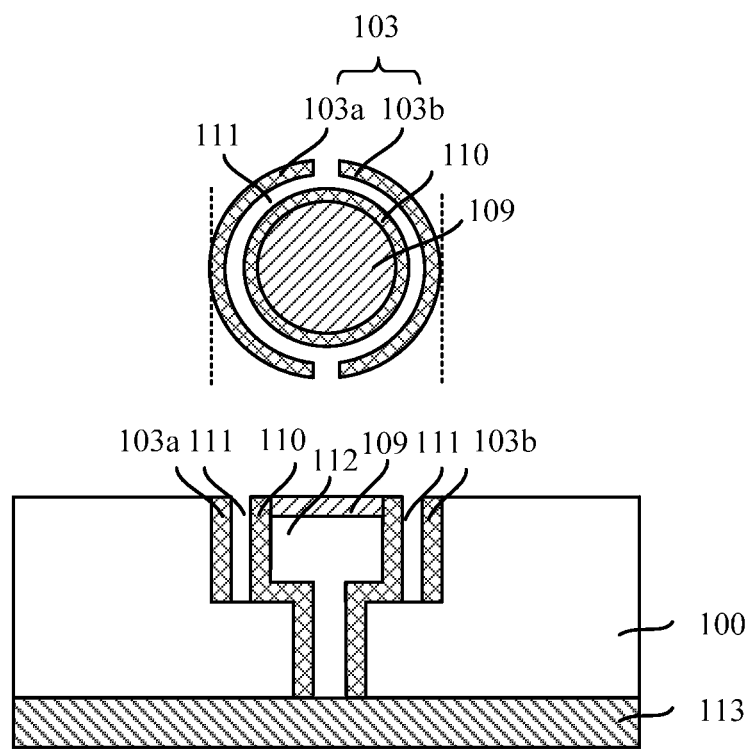
Figure 15:
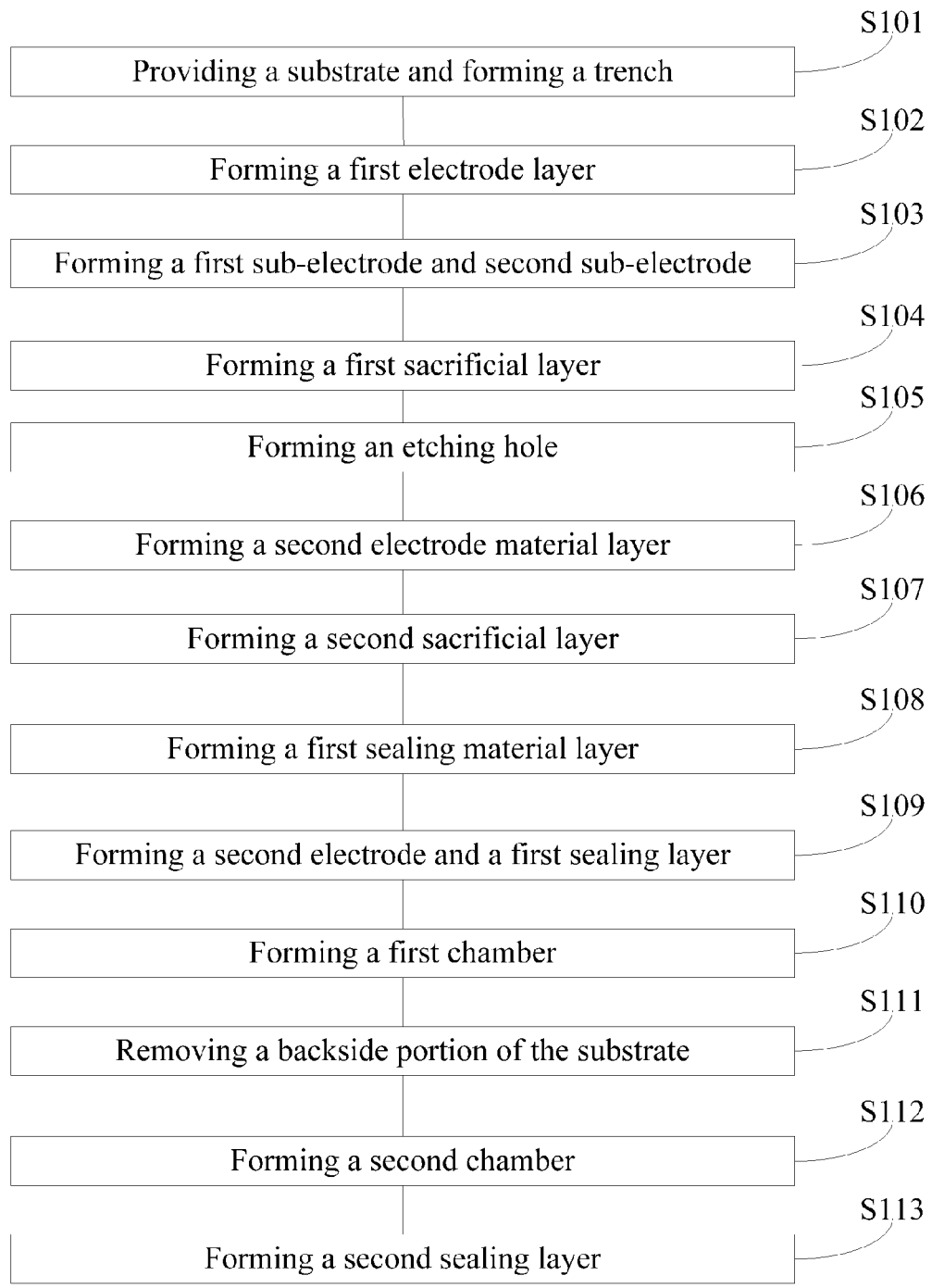
FIG. 15 illustrates an exemplary fabrication process of a capacitive pressure sensor consistent with the disclosed embodiments.

FIG. 15 illustrates an exemplary fabrication process of a capacitive pressure sensor; and FIGS. 2-14 illustrate exemplary semiconductor structures corresponding to various stages of the fabrication process.

Figure 2:
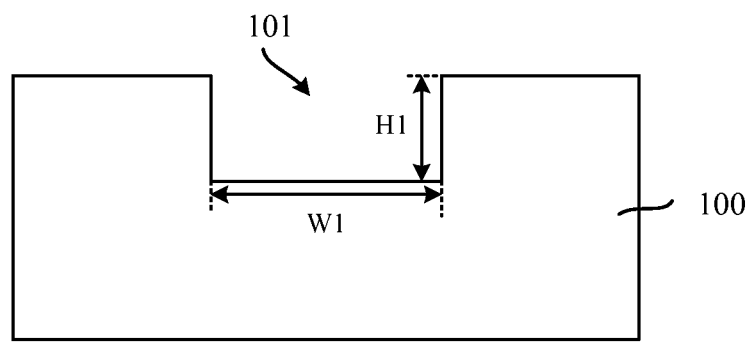
FIGS. 2-14 illustrate semiconductor structures corresponding to certain stages of an exemplary fabrication process of a capacitive pressure sensor consistent with the disclosed embodiments.

As shown in FIG. 15, at the beginning of the fabrication process, a substrate with certain structures is provided (S101). FIG. 2 illustrates a corresponding semiconductor structure.

As shown in FIG. 2, a substrate 100 is provided. A trench 101 is formed in the substrate 100. The substrate 100 may provide a base for a subsequently formed capacitive pressure sensor. The trench 101 may be used to subsequently form a first electrode and a second electrode.

The substrate 100 may be a single layer structure, or a multilayer structure. When the substrate 100 is a multilayer structure, for example, a double layer structure, the substrate 100 may include a semiconductor substrate and a dielectric layer formed on a surface of the semiconductor substrate, or a first dielectric layer and a second dielectric layer formed on the first dielectric layer.

In one embodiment, the substrate 100 is a double layer structure. The substrate 100 may include a semiconductor substrate and a dielectric layer formed on the semiconductor substrate. The semiconductor substrate may include any appropriate semiconductor material, such as silicon, silicon on insulator (SOI), silicon germanium, carborundum, indium antimonide, lead telluride, indium arsenide, indium phosphide, gallium arsenidie, gallium antimonite, alloy semiconductor or a combination thereof. The semiconductor substrate may also be germanium on insulator (GOI), or glass substrate, etc. The dielectric layer may be made of any appropriate material, such as silicon oxide, silicon nitride or silicon oxynitride, or silicon carbonitride, etc. In one embodiment, the semiconductor substrate is silicon; and the dielectric layer is silicon oxide. The trench 101 may be in the dielectric layer; a portion of a subsequently formed etching hole may be in the dielectric layer; and a portion of the subsequently formed etching hole may be in the semiconductor substrate.

Various processes may be used to form the trench 101 in the substrate 100, such as a dry etching process, a wet etching process, or an ion beam etching process, etc. In one embodiment, the trench 101 is formed by a dry etching process, for example, a plasma etching process. Specifically, a process for forming the trench 101 may include forming a mask layer having an opening exposing the substrate 100 (not shown) on the substrate 100, followed by etching the substrate 100 along the opening.

A first electrode and a second electrode may be subsequently formed on a side surface of the trench 101, thus the first electrode and the second electrode may be vertical to the surface of the substrate 100. Caparing with an electrode parallel to the surface of the substrate 100, the first electrode and the second electrode may occupy a relatively small area of the substrate 100, thus it may aid to increase an integration level of devices.

The first electrode and the second electrode may have similar shapes with the trench 101. Thus, in order to increase an overlap area of the first electrode and the second electrode, so as to cause the capacitor of a capacitive pressure sensor to have a relatively large capacitance, the trench 101 may at lease have two arc sidewalls facing to each other. The arc sidewalls may include circular arc sidewalls, elliptical arc sidewalls, or polygonal arc sidewalls, etc.

Specifically, a cross-section of the trench 101 may be a circle, an eclipse, or two facing polygons with arc sides. The cross-section of the trench 101 may refer to a top view of a cross-section parallel to the surface of the substrate 100.

In one embodiment, the cross-section of the trench 101 is a circle. Referring to FIG. 2, a depth "H1" of the trench 101 may be in a range of approximately 0.1 µm~10 µm. A width "W1" of the trench 101 may be in a range of approximately 0.1 µm~10000 µm. Other appropriate combinations of depth and width may also be used.

Figure 3:
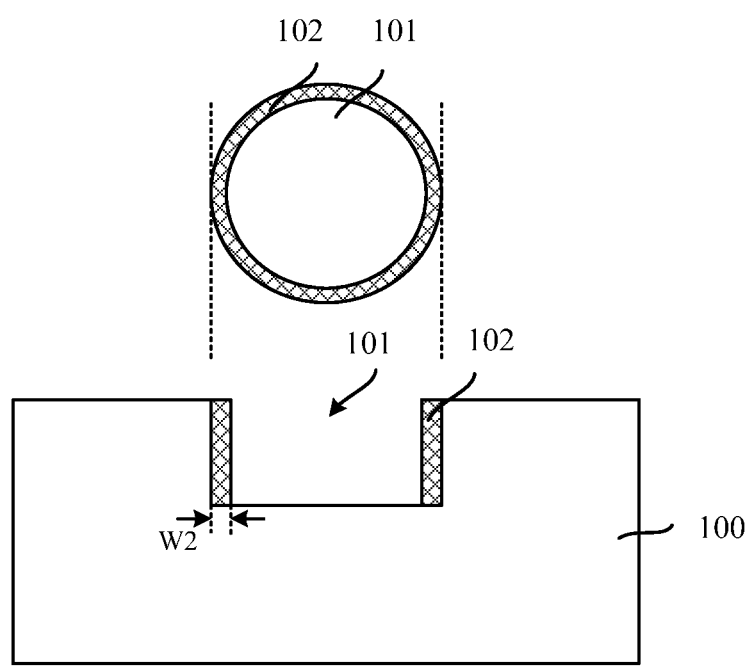

Returning to FIG. 15, after providing the substrate 100 with the trench 101, a first electrode layer may be formed (S102). FIG. 3 illustrates a corresponding semiconductor structure.

As shown in FIG. 3, a first electrode layer 102 is formed on a side surface of the trench 101. The first electrode layer 102 may be used to subsequently form a first electrode.

A process for forming the first electrode layer 102 may include forming a first electrode material layer (not shown) on a side surface and a bottom surface of the trench 101 and the surface of the substrate 100; and removing a portion of the first electrode material layer on the bottom of the trench 101 and the surface of the substrate 100 by a mask-less etching process. Thus, the first electrode layer 102 with a loop shape may be formed on the side surface of the trench 101. The mask-less etching process may refer to an etch back process.

In one embodiment, a cross-section view of the trench 101 is a circle, thus the first electrode layer 102 is a circular loop. In certain other embodiments, if the cross-section view of the trench 101 is other shape, the first electrode layer 102 may correspondingly be other shape.

Referring to FIG. 3, a thickness "W2' of the first electrode layer 102 may be in a range of approximately 0.1 μm~10 μm. The thickness "W2" of the first electrode layer 102 may correspond to a thickness of the first electrode material layer on the side surface of the trench 101. In certain other embodiments, the thickness "W2" of the first electrode layer 102 may be other appropriate value.

The first electrode layer 102 may be made of any appropriate material, such as Al, Cu, Ag, Au, Pt, Ni, Ti, TiN, TaN, Ta, TaC, TaSiN, W, WN, or WSi, etc. The first electrode layer 102 may be a single layer structure. The first electrode layer 102 may also be a multiple-layer structure.

In one embodiment, the first electrode layer 102 is a single layer structure made of TiN. TiN may have a relatively good conductivity and adhesive property, thus a resistance of the first electrode layer 102 may be relatively small. Further, it may be difficult for the first electrode 102 to peel off from the side surface of the trench 101.

Various processes may be used to form the first electrode layer 102, such as a chemical vapor deposition (CVD) process, a physical vapor deposition (PVD) process, an atomic layer deposition (ALD) process, a flowable CVD (FCVD) process, an electroplating process, or a sputtering process, etc. In one embodiment, the first electrode layer 102 is formed by a sputtering process. The first electrode layer 102 formed by the sputtering process may have a relatively smooth surface and an accurate thickness "W2", thus an measuring accuracy of the capacitive pressure sensor having such a first electrode layer may be improved.

The mask-less etching process may include any appropriate etching process, such as a dry etching process, a wet etching process, or an ion beam etching process, etc.

Figure 4:
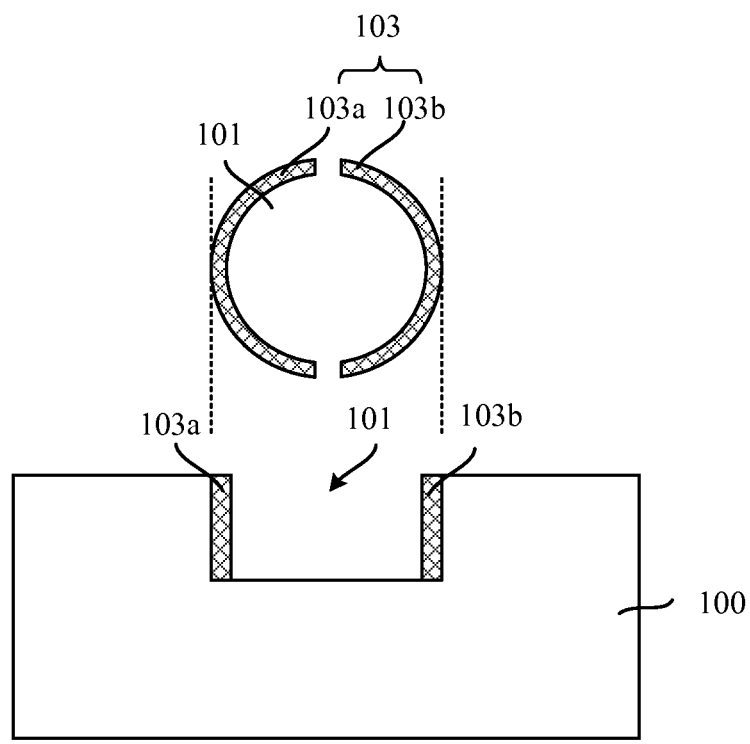

Returning to FIG. 15, after forming the first electrode layer 102, the first electrode layer 102 may be broken to form sub-electrodes (S103). FIG. 4 illustrates a corresponding semiconductor structure.

As shown in FIG. 4, a portion of the first electrode layer 102 may be removed; and the first electrode layer 102 is broken into a first sub-electrode 103a and a second sub-electrode 103b. The first sub-electrode 103a and the second sub-electrode 103b may form a first electrode 103. The first sub-electrode 103a and the second sub-electrode 103b may be configured as an electrode of a subsequently formed first capacitor and an electrode of a subsequently formed second electrode, respectively. The first capacitor and the second capacitor may be included in one capacitive pressure sensor.

A process for forming the first sub-electrode 103a and the second sub-electrode 103b may include forming a mask layer (not shown) on substrate 100 and the first electrode layer 102. The mask layer may fill up the trench 101. The process may also include pattering the mask layer; and forming openings in the mask layer. The openings may expose the removed portion of the first electrode layer 102. Further, the process may include etching the first electrode layer 102 exposed by the openings along the openings to break the first electrode layer 102 into two parts, thus the discrete first sub-electrode 103a and second sub-electrode 103b may be formed. Further, after forming the first sub-electrode 103a and the second sub-electrode 103b, the mask layer may be removed.

In one embodiment, the first electrode layer 102 is broken at the middle to cause an area of the first sub-electrode 103a to be equal to an area of the second sub-electrode 103b, facing each other, thus a capacitance of the subsequently formed first capacitor and a capacitance of the subsequently formed second capacitor may be equal.

In certain other embodiments, the first electrode layer 102 may be broken at other positions; an area of the first sub-electrode 103a may be unequal to an area of the second sub-electrode 103b.

Figure 5:
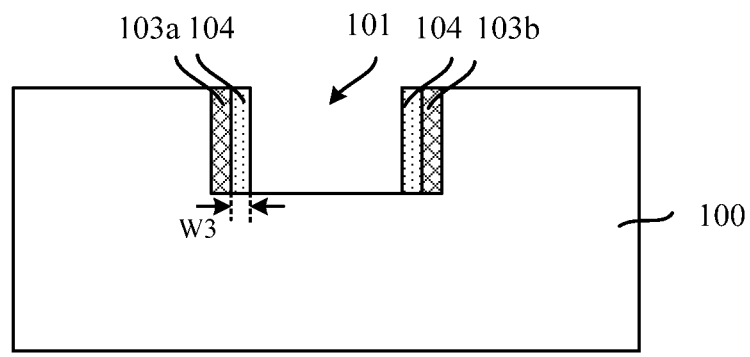

Returning to FIG. 15, after forming the first sub-electrode 103a and the second sub-electrode 103b, a first sacrificial layer may be formed on side surfaces of the first sub-electrode 103a and the second sub-electrode 103b (S104). FIG. 5 illustrates a corresponding semiconductor structure.

As shown in FIG. 5, a sacrificial layer 104 is formed on the side surfaces of the first sub electrode 103a and the second sub-electrode 103b. In certain other embodiments, the first sacrificial layer 104 may only be formed on the first sub-electrode 103a. The first sacrificial layer 104 may be used to subsequently form a first chamber between the first sub-electrode 103a and the second sub-electrode 103b.

A process for forming the first sacrificial layer 104 may include forming a first sacrificial material layer on the side surfaces and tope surfaces of the first sub-electrode 103 and the second sub-electrode layer 103b, and the surface of the substrate 100; and followed by a mask-less etching process (may also refer to an etch back process). Thus, the first sacrificial material layer on the top surfaces of the first sub-electrode 103a and the second sub-electrode 103b and the surface of the substrate 100 may be removed; and the first sacrificial layer 104 may be formed.

The first electrode 103 and a subsequently formed second electrode of the capacitive pressure sensor may both vertical to the substrate 100; and the first electrode 103 may surround the second electrode. Further, the second electrode may be a hollow loop structure having a second chamber in middle; and the second electrode may be sealed by a first sealing layer on the top of the second electrode.

When the first sealing layer senses a pressure, the second electrode may shrink toward the second chamber (or a direction far from the first electrode 103), thus a distance between the first electrode 103 and the second electrode may be increased; and the capacitance of a capacitor formed by the first electrode 103 and the second electrode may be changed. Therefore, the thickness of the first electrode 103, a thickness "W3" of the sacrificial layer 104 and a thickness of the second electrode may be significantly small.

Such small thicknesses may cause the first electrode 103, the second electrode and the first sacrificial layer 104 to occupy a relatively small area of the substrate 100, thus it may aid to increase the device integration level. In one embodiment, a thickness "W4" of the first sacrificial layer 104 may be in a range of approximately 0.1 μm~10 μm. In certain other embodiment, the thickness "W4" of the first sacrificial layer 104 may be other appropriate value.

The first sacrificial layer 104 may be made of any appropriate material. Characteristics of the material for the first sacrificial layer 104 may include easy to be removed and a high etching selectivity ratio to the substrate 100, the first electrode 103, the subsequently formed second electrode, the subsequently formed first sealing layer and a subsequently formed second sealing layer. When the first sacrificial layer 103 made of such material is subsequently removed, it may easy to be completely removed; and it may reduce damages to the substrate 100, the first electrode 103, the subsequently formed second electrode, the subsequently formed first sealing layer and a subsequently formed second sealing layer.

Materials having such a characteristic may include bottom antireflection layer, amorphous carbon, poly silicon, amorphous silicon, SiN, SiON, SiCN, SiC, BN, SiCOH, or SiGe, etc. In one embodiment, the first sacrificial layer 104 is made of amorphous carbon.

Various processes may be used to form the first sacrificial layer 104, such as a CVD process, a PVD process, an ALD process, or an FCVD process. The mask-less etching process may include a dry etching process, a wet etching process, or an ion beam etching process, etc.

Figure 6:
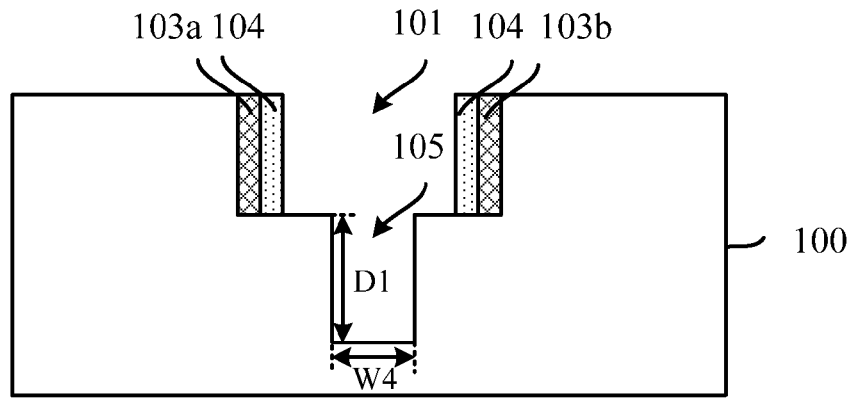

Returning to FIG. 15, after forming the first sacrificial layer 104, an etching hole may be formed in the substrate 100 under the bottom of the trench 101 (S105). FIG. 6 illustrates a corresponding semiconductor structure.

As shown in FIG. 6, an etching hole 105 is formed in substrate 100 under the bottom of the trench 101. A portion of a second electrode facing to the first electrode 103 may be subsequently formed in the trench 101. A portion of the second electrode may also be formed inside the etching hole 105, thus the portion of the second electrode formed inside the etching hole 105 may increase the mechanical strength and adhesion properties of the second electrode; and prevent the second electrode from peeling off.

A top view of the etching hole 105 may include any appropriate shape, such as a circular shape, a triangular shape, or a rectangular shape, etc.

A width "W4" of the etching hole 105 may be smaller than the width "W1" of the trench 101. In one embodiment, the width of the etching hole 105 may be in a range of approximately 0.1 μm~10000 μm. The etching hole 105 may have any appropriate depth. In one embodiment, the depth "D1" of the etching hole 105 may be greater than approximately 50 μm. In certain other embodiments, the etching hole 105 may be a through silicon hole. The portion of the second electrode formed in the etching hole 105 may be referred as a through silicon via (TSV). In certain other embodiments, the etching hole 105 may have other appropriate width "W4" and depth "D1".

Figure 7:
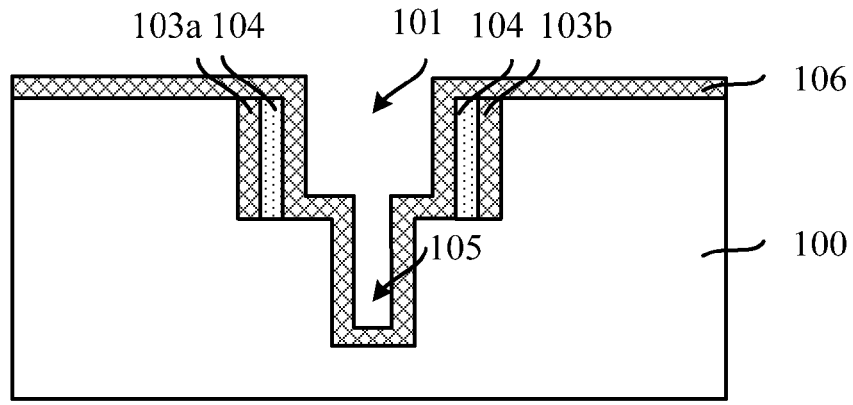

Returning to FIG. 15, after forming the etching hole 105, a second electrode material layer may be formed (S106). FIG. 7 illustrates a corresponding semiconductor structure.

As shown in FIG. 7, a second electrode material layer 106 is formed on a surface and a bottom surface of the etching hole, a portion the bottom surface of the trench 101, a side surface and a top surface of the first sacrificial layer 104, the top surfaces of the first sub-electrode 103a and the second sub-electrode 103b, and the surface of the substrate 100. The second electrode material layer 106 may be used to subsequently form a second electrode.

The second electrode material layer 106 may be a single layer structure or a multiple-stacked structure. A variety of conductive material may be used as the second electrode material layer 106, such as Al, Cu, Ag, Au, Pt, Ni, Ti, TiN, TaN, Ta, TaC, TaSiN, W, WN or WSi, etc. The second electrode material layer 106 may be made of a same material as the first electrode 103. The second electrode material layer 106 may also be made of a material different from the first electrode 103.

Various processes may be used to form the second electrode material layer 106, such as a PVD process, a CVD process, an ALD process, an FCVD process, or a sputtering process, etc. In one embodiment, the second electrode material layer 106 is formed by a sputtering process.

A thickness of the second electrode material layer 106 may be relatively small, so as that a second electrode formed by the second electrode material layer 106 may have a high sensitivity to a pressure; and it may be easy for the second electrode to deform along a lateral direction. Thus, the distance between the first electrode 103 and the second electrode may be easy to change. In one embodiment, the thickness of the second electrode material layer 106 may be in a range of 0.1 μm~10 μm, such as 0.1 μm, 0.5 μm, 1 μm, 2 μm, 5 μm, 7 μm, 9 μm, or 10 μm. In certain other embodiments, the thickness of the second electrode material layer 106 may be other appropriate value.

Figure 8:
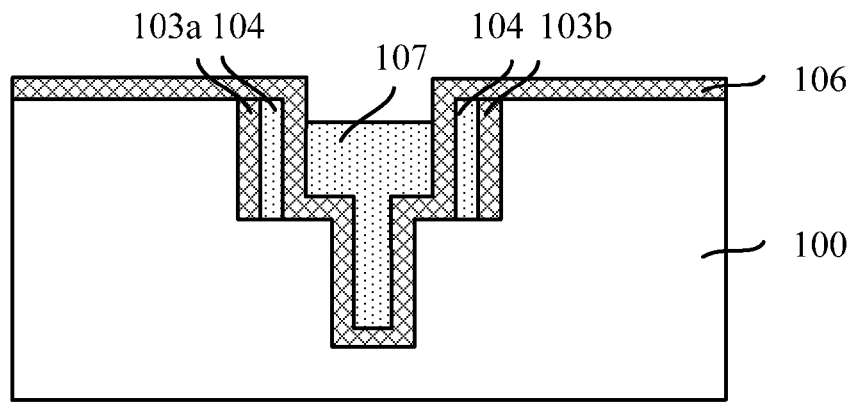

Returning to FIG. 15, after forming the second electrode material layer 106, a second sacrificial layer may be formed (S107). FIG. 8 illustrates a corresponding semiconductor.

As shown in FIG. 8, a second sacrificial layer 107 is formed on a portion of the second electrode material layer 106. The second sacrificial layer 107 may fill up the etching hole 105 and the trench 101; and a surface of the second sacrificial layer 107 may be lower than the surface of the substrate 100. The second sacrificial layer 107 may be subsequently removed to form a second chamber in the middle of the second electrode.

A process for forming the second sacrificial layer 107 may include forming a second sacrificial material layer (not shown) covering the second electrode material layer 106 and filling up the etching hole 105 and the trench 101; and followed by an etch back process to remove a portion of the second sacrificial material layer on the surface of the second electrode material layer 106 and a portion the second sacrificial material layer in the trench 101, thus the second sacrificial layer 107 may be formed.

The surface of the second sacrificial layer 107 may be lower than the surface of the substrate 100, when a first sealing layer is subsequently formed on the second sacrificial layer 107, a surface of the first sealing layer may level with a surface of a second electrode. After subsequently removing the second sacrificial layer 107, a second chamber may be formed; and the first sealing layer and the second electrode may both have a relatively high sensitivity to a pressure. Further, the surface of the substrate 100 may be flat; and it may easy to subsequently planarize the backside of the substrate 100. A distance between the surface of the second sacrificial layer 107 and the surface of the substrate 100 may be in a range of approximately 0.1 μm~10 μm.

In certain other embodiments, the surface of the second sacrificial layer 107 may level with the surface of the substrate 100. After subsequently forming a second electrode, a first sealing layer may be formed on the second sacrificial layer 107 and the second electrode.

The second sacrificial layer 107 may be made of any appropriate material. Characteristics of the material for the second sacrificial layer 107 may include easy to be removed and a high etching selectivity ratio to the substrate 100, the first electrode 103, the subsequently formed second electrode, the subsequently formed first sealing layer and a subsequently formed second sealing layer. The second sacrificial layer 107 may be made of a material same as the first sacrificial layer 104. The second sacrificial layer 107 may also be made of a material different from the first sacrificial layer 104.

Materials having such a characteristic may include bottom antireflection layer, amorphous carbon, poly silicon, amorphous silicon, SiN, SiON, SiCN, SiC, BN, SiCOH, or SiGe, etc. In one embodiment, the second sacrificial layer 107 is made of bottom antireflection layer.

Various processes may be used to form the second sacrificial layer 107, such as a CVD process, a PVD process, an ALD process, or an FCVD process, etc. The etch back process may include a dry etching process, a wet etching process, or an ion beam etching process, etc.

Figure 9:
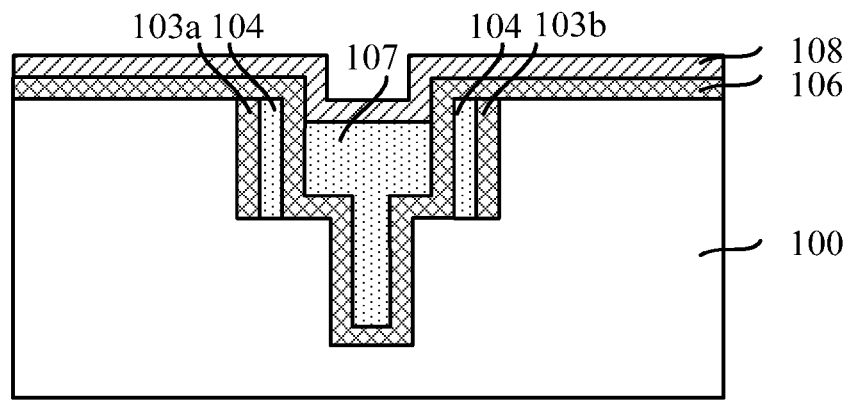

Returning to FIG. 15, after forming the second sacrificial layer 107, a first sealing material layer may be formed (S108). FIG. 9 illustrates a corresponding semiconductor structure.

As shown in FIG. 9, a first sealing layer material layer 108 is formed on the second sacrificial layer 107 and the second electrode material layer 106. The first sealing material layer 108 may be used to subsequently form a first sealing layer.

The first sealing material layer 108 may be made of a material different from the first sacrificial layer 104 and the second sacrificial material layer 107. The first sealing material layer 108 may be made of any appropriate material, such as poly silicon, amorphous silicon, SiN, SiON, SiCN, SiC or BN, etc. In one embodiment, the first sealing material layer 108 is made of SiN.

Various processes may be used to form the first sealing material layer 108, such as a CVD process, a PVD process, an ALD process, or an FCVD process, etc.

Figure 10:
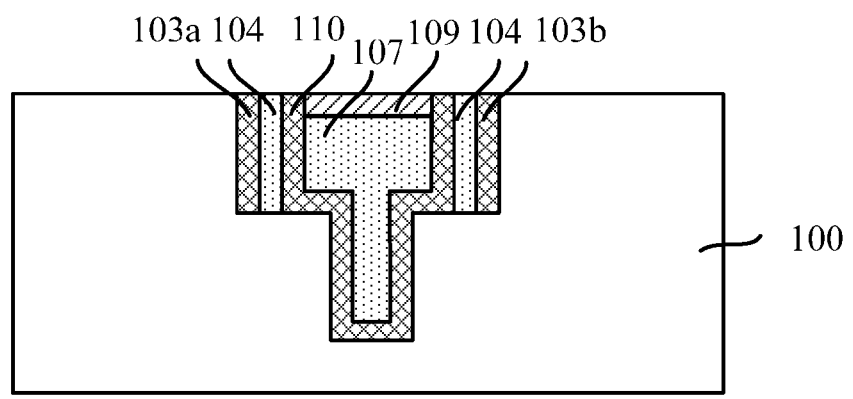

Returning to FIG. 15, after forming the first sealing material layer 108, a second electrode and a first sealing layer may be formed (S109). FIG. 10 illustrates a corresponding semiconductor structure.

As shown in FIG. 10, a second electrode 110 and a first sealing layer 109 are formed by planarizing the first sealing material layer 108 and the second electrode material layer 106 until the surface of the substrate 100 is exposed. The second electrode 110 may have a loop shape. The first sealing layer 109 may be formed on the second sacrificial layer 107.

A planarization process for forming the second electrode 110 and the first sealing layer 109 may be a chemical mechanical polishing (CMP) process, a mechanical polishing process, or an ion beam polishing process, etc. In one embodiment, a CMP process is used to planarize the first sealing material layer 108 and the second electrode material layer 106 to form the second electrode 110 and the first sealing layer 109.

A thickness of the second electrode 110 may be relatively small; such a small thickness may aid the second electrode 110 to have a relatively high sensitivity to a pressure. When the second electrode 110 senses the pressure, it may be easy for the second electrode 110 to deform along a lateral direction; and it may cause a distance change between the first electrode 103 and the second electrode 110 to have a relatively high sensitivity to the pressure, thus the sensitivity of a capacitive pressure sensor having the first electrode 103 and the second electrode 110 may be improved. In one embodiment, a thickness of the second electrode 110 may be in a range of approximately 0.1 μm~10 μm, such as 0.1 μm, 0.5 μm, 1 μm, 2 μm, 5 μm, 7 μm, 9 μm, or 10 μm, etc. In certain other embodiments, the thickness of the second electrode 110 may have other appropriate value.

In one embodiment, a surface of the first sealing layer 109 may level with a top surface of the second electrode 110. A thickness of the first sealing layer 109 may be in a range of approximately 0.1 μm~10 μm. In certain other embodiments, the thickness of the first sealing layer 109 may have other appropriate value.

In certain other embodiments, a portion of the first sealing layer 109 may be on the top surface of the second electrode 110, such a configuration may increase a contact area between the first sealing layer 109 and the second electrode 110; and it may increase the adhesion strength between the first sealing layer 109 and the second electrode 110.

A process for forming a first sealing layer 109 having a portion on the top surface of the second electrode 110 may include forming a mask layer (not shown) having an opening on the first sealing material layer 108. The opening may expose a portion of the first sealing material layer 108 on the substrate 100 away from an outer side of the trench 101. Further, the process may include removing the portion of the first sealing material layer 109 and a portion of the second electrode material layer 106 exposed by the mask layer. Thus, the first sealing layer 109 and the second electrode 110 may be formed. The top surface of the second electrode 110 may be slightly higher than the surface of the substrate 100; and the first sealing layer 109 may partially cover the top surface of the second electrode 110.

Figure 11:
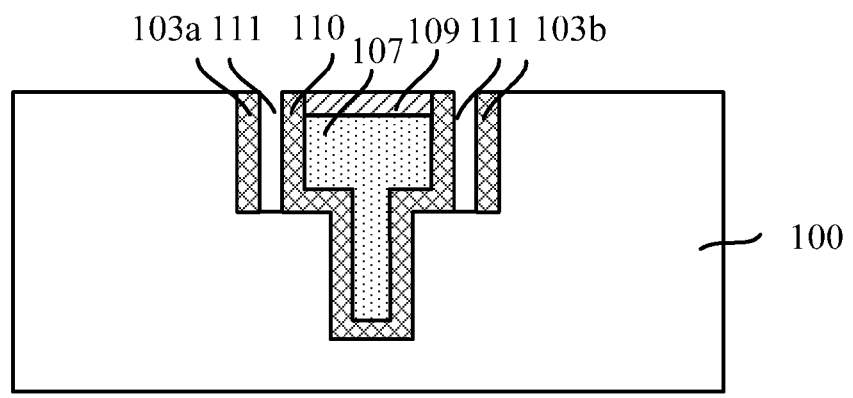

Returning to FIG. 15, after forming the first sealing layer 109 and the second electrode 110, the first sacrificial layer 104 may be removed; and a first chamber may be formed (S110). FIG. 11 illustrates a corresponding semiconductor structure.

As shown in FIG. 11, the first sacrificial layer 104 may be removed, and a first chamber 111 may be formed between the first electrode 103 (first sub-electrode 103a and the second sub-electrode 103b) and the second electrode 110.

The first sacrificial layer 104 may be removed by any appropriate process, such as a dry etching process, a wet etching process, or an ion beam etching process, etc. In one embodiment, the first sacrificial layer 104 is made of amorphous carbon; a dry etching process using an ammonia-contained plasma is used to remove the first sacrificial layer 104.

Figure 12:
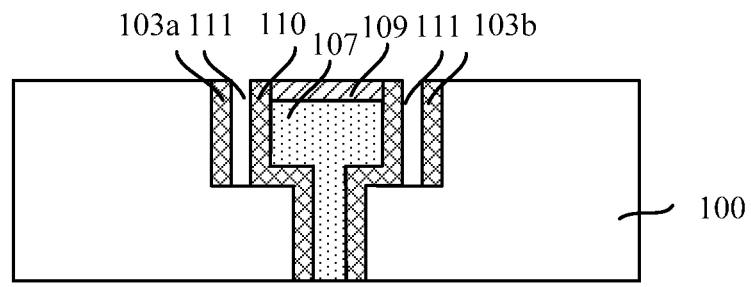

Returning to FIG. 15, after removing the first sacrificial layer 104, a backside portion of the substrate 100 may be removed (S111). FIG. 12 illustrates a corresponding semiconductor structure.

As shown in FIG. 12, a backside portion of the substrate 100 is removed. A planarization process may be used to remove the backside portion of the substrate 100 until a bottom surface of the second sacrificial layer 107 in the etching hole 105 is exposed. In certain other embodiments, if the etching hole 105 is a through-silicon-via (TSV) structure, the backside portion of the silicon 100 may be kept.

Various processes may be used to remove the backside portion of the substrate 100, such as a CMP process, a mechanical polishing process, or an ion beam etching process, etc. In one embodiment, the backside portion of the substrate 100 is removed by a CMP process. During the CMP process, a portion of the second electrode 110 may also be removed, thus the bottom surface of the second sacrificial layer 107 may be exposed. The second sacrificial layer 107 may subsequently be removed; and a second chamber may be formed in the second electrode 110.

In certain other embodiments, a second etching hole (not shown) may be formed by etching the backside of the substrate 100 and the portion of the second electrode 110 under the bottom of the second sacrificial layer 107 until the second sacrificial layer 107 is exposed. The second etching hole may be used to subsequently remove the second sacrificial layer 107 to form the second chamber. The second etching hole, the etching hole 105 and a portion of the trench 101 may together form the second chamber.

Figure 13:
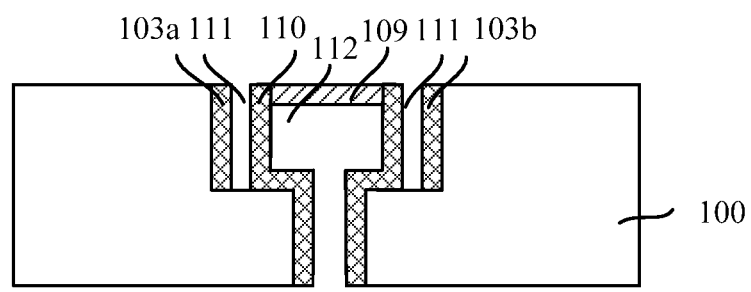

Returning to FIG. 15, after removing the backside portion of the substrate 100 to expose the second sacrificial layer 107, the second sacrificial layer 107 may be removed (S112). FIG. 13 illustrates a corresponding semiconductor structure.

As shown in FIG. 13, the second sacrificial layer 107 is removed; and a second chamber 112 is formed.

Various processes may be used to remove the second sacrificial layer 107 to form the second chamber 112, such as a wet etching process, a dry etching process, or an ion beam etching process, etc. In one embodiment, the second sacrificial layer 107 is made of bottom antireflection layer; a plasma ashing process is used to remove the second sacrificial layer 107.

After forming the second chamber 112 by removing the second sacrificial layer 107, the first sealing layer 109 and the second electrode 110 in the trench 105 may be suspended. The first sealing layer 109 and the second electrode 110 in the trench 105 may both be able to sense a pressure, thus a sensing area may be increased; and a pressure sensitivity may be increased. Therefore, a sensitivity of the capacitive pressure sensor formed by the first electrode 103 (including the first sub-electrode 103a and the second electrode 103b), the second electrode 110, the first chamber 111 and the second chamber 112 may be improved.

Returning to FIG. 15, after forming the second chamber 112, a second sealing layer may be formed to seal the second chamber 112 (S113). FIG. 14 illustrates a corresponding semiconductor structure.

As shown in FIG. 14, a second sealing layer 113 is formed on the back surface of the substrate 100; and the second chamber 112 may be sealed by the second sealing layer 113.

The second sealing layer 113 may be made of any appropriate material, such as SiN, SiON, SiCN, SiC, BN, or epoxy, etc.

Various processes may be used to form the second sealing layer 113, such as a CVD process, a PVD process, an ALD process, an FCVD process, or a spin-coating process, etc. In one embodiment, the second sealing layer 113 is formed by a low-pressure CVD process. After forming the second sealing layer 113 using a low-pressure CVD process, the second chamber 112 may be sealed with a low pressure.

In certain other embodiments, the second sealing layer 113 may be a silicon wafer, a silicon carbide wafer or a silicon germanium substrate, etc. A wafer bonding process may be used to bond the second sealing layer 113 with the back surface of the substrate 100; and the second chamber 112 may be sealed. The wafer bonding process may include an anodic bonding process, a glass slurry bonding process, a direction silicon bonding process, a low temperature bonding process, or a metal diffusion bonding process, etc.

After forming a capacitive pressure sensor having the first electrode 103 (including the first sub-electrode 103a and the second sub-electrode 103b), the second electrode 110 and the chamber 111, control circuits (not shown) and interconnection structures (not shown) may be formed in other regions of the substrate 100. The first sub-electrode 103a and the second sub-electrode 103b may connect with the control circuits through the interconnection structures. The control circuits may be used to receive, process and transfer signals from the capacitor.

In one embodiment, the control circuits may be formed on the semiconductor substrate 100; followed by forming a dielectric layer on the semiconductor substrate. The semiconductor substrate and the dielectric layer may form the substrate 100. Then, the capacitive pressure sensor may be formed in the dielectric layer. Further, the interconnection structures may also be formed in the dielectric layer to connect the capacitive pressure sensor with the control circuits.

In certain other embodiments, the control circuits may be formed on a second substrate (or a second semiconductor substrate). After forming the capacitive pressure sensor, the second substrate having the control circuits and the substrate 100 having the capacitive pressure sensor may be stacked; and then the capacitive pressure sensor and the control circuits may be connected together by through-hole structures (interconnection structures).

Referring to FIG. 14, capacitors of the capacitive pressure sensor may include a first capacitor and a second capacitor connected in serial. The first capacitor may include the first sub-electrode 103a, the first chamber 111 and a portion of the second electrode 110 facing the first sub-electrode 103a. The second capacitor may include the second sub-electrode 103b, the first chamber 111 and a portion of the second electrode 110 facing the second sub-electrode 103b. The first capacitor and the second capacitor may connect with each other by a portion of the second electrode 110. The first sub-electrode 103a and the second sub-electrode 103b may be connected with the control circuits by the interconnection structures. Caparing with the capacitive pressure sensor having a planar capacitor, such a three-dimensionally configured capacitive pressure sensor may have a significantly higher pressure sensitivity.

When one or more of the first sealing layer 109 and the second electrode 110 senses a pressure, the second electrode 110 may shrink toward the second chamber 112 (or may generate a lateral deformation), a distance between the first electrode 103 and the second electrode 110 may be changed, thus a capacitance of the first capacitor and the a capacitance of the second capacitor may change. Such capacitance changes may be received and processed by the control circuits, thus the value of the pressure may be obtained.

Thus, a capacitive pressure sensor may be formed by the above disclosed processes and methods; and the corresponding capacitive pressure sensor is illustrated in FIG. 14. The capacitive pressure sensor includes a substrate 100 and a second sealing layer 113. The capacitive pressure sensor also includes a first sub-electrode 103a and a second sub-electrode 103b formed in the substrate 100. Further, the capacitive pressure sensor include a second electrode 110 formed in the substrate 100 and a first sealing layer 109 formed on the second electrode 110. Further, the capacitive pressure sensor also includes a first chamber formed between the first electrode 103 (including a first sub-electrode 103a and the second sub-electrode 103b) and the second electrode 110 and a second chamber 112 formed in the second electrode 110. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A capacitive pressure sensor, comprising:
  a substrate having a trench and a through hole connecting a bottom surface of the trench and a first surface of the substrate;

a first electrode formed on a side surface of the trench being vertical to a second surface of the substrate, wherein the first electrode includes a first sub-electrode and a second sub-electrode;

a second electrode formed in the trench and the through hole, wherein a first portion of the second electrode is formed on side surfaces of the through hole, and a second portion of the second electrode is formed in the trench, a first chamber being formed between the first electrode and the second electrode;

a second chamber formed in the second electrode;

a first sealing layer formed on the second electrode such that the second electrode and the first sealing layer are suspended; and a second sealing layer formed on the first surface of the substrate to seal the through hole.

2. The capacitive pressure sensor according to claim 1, wherein the second chamber is formed by:

forming the trench in the substrate;

forming a first electrode having the first sub-electrode and the second sub-electrode on the side surface of the trench, a cross-section of the first electrode having a loop shape;

forming a first sacrificial layer on a side surface of the first electrode;

etching the substrate under the trench to forming the through hole;

forming a second electrode on side surfaces of the through hole and the first sacrificial layer, a portion of a top surface of the trench, and the bottom surface of the through hole, a cross-section of the second electrode having a loop shape;

forming a second sacrificial layer on the second electrode to fill up the trench and the through hole;

forming the first sealing layer on the second sacrificial layer;

planarizing the first surface of the substrate to expose a bottom surface of the second sacrificial layer at the bottom surface of the through hole; and removing the second sacrificial layer to form the second chamber.

3. The capacitive pressure sensor according to claim 1, wherein:

the first electrode and the second electrode are made of one or more of metal, conductive material, and semiconductor material including Al, Cu, Ag, Au, Pt, Ni, Ti, TiN, TaN, Ta, TaC, TaSiN, W, WN, or WSi.

4. The capacitive pressure sensor according to claim 1, wherein:

the second sealing layer is made of one or more of organic material, dielectric material, or conductive material including SiN, SiON, SiCN, SiC, BN, and epoxy.

5. The capacitive pressure sensor according to claim 2, wherein:

the first sacrificial layer and the second sacrificial layer are made of a same material or different materials.

6. The capacitive pressure sensor according to claim 5, wherein:

the first sacrificial layer and the second sacrificial layer are made of one or more of organic material, dielectric material and conductive material including bottom antireflection layer, amorphous silicon, amorphous carbon, SiN, SiON, SiCN, SiC, BN, SiCOH, and SiGe.

7. The capacitive pressure sensor according to claim 1, wherein:

an area of the first sub-electrode is equal to an area of the second sub-electrode.

8. The capacitive pressure sensor according to claim 1, wherein:

a thickness of the first electrode is in a range of approximately $0.1$ μm-$10$ μm; and a thickness of the second electrode is in a range of approximately $0.1$ μm-$10$ μm.

9. The capacitive pressure sensor according to claim 2, wherein:

a thickness of the first sacrificial layer is in a range of approximately $0.1$ μm-$10$ μm.

10. The capacitive pressure sensor according to claim 2, wherein:

a width of the trench is in a range of approximately $0.1$ μm-$10000$ μm; and a depth of the trench is in a range of approximately $0.1$ μm-$10$ μm.

11. The capacitive pressure sensor according to claim 1, wherein a top surface of the first sealing layer is higher than the second surface of the substrate.

12. The capacitive pressure sensor according to claim 11, wherein a top surface of the first sealing layer levels with a top surface of the second electrode.

13. The capacitive pressure sensor according to claim 11, wherein a top surface of the first sealing layer partially covers a top surface of the second electrode.

14. The capacitive pressure sensor according to claim 2, wherein a top surface of the second sacrificial layer is lower than the second surface of the substrate.

15. The capacitive pressure sensor according to claim 7, wherein the first sub-electrode and the second electrode form a first capacitor, and the second sub-electrode and the second electrode form a second capacitor, the first capacitor and the second capacitor being connected in series.

16. The capacitive pressure sensor according to claim 1, wherein the first sealing layer and the second electrode are both able to sense a pressure.

17. The capacitive pressure sensor according to claim 1, wherein the substrate includes a semiconductor substrate and a dielectric layer formed on the substrate, the trench being formed in the semiconductor substrate, and the through hole being formed in both the semiconductor substrate and the dielectric layer.

18. The capacitive pressure sensor according to claim 1, wherein the second chamber includes a first hollow portion in the trench and a second hollow portion in the through hole, the first hollow portion being connected with the second hollow portion.

* * * * *